(12) United States Patent
Lim et al.

(10) Patent No.: US 7,149,671 B2
(45) Date of Patent: Dec. 12, 2006

(54) METHOD AND SYSTEM FOR COORDINATE TRANSFORMATION TO MODEL RADIAL FLOW NEAR A SINGULARITY

(75) Inventors: Kok-Thye Lim, San Ramone, CA (US); Stephen R. Kennon, Austin, TX (US)

(73) Assignee: Object Reservoir, Inc., Austin, TX (US)

( * ) Notice: Subject to any disclaimer, the term of this patent is extended or adjusted under 35 U.S.C. 154(b) by 890 days.

(21) Appl. No.: 09/896,101

(22) Filed: Jun. 29, 2001

(65) Prior Publication Data

US 2002/0082813 A1   Jun. 27, 2002

Related U.S. Application Data

(60) Provisional application No. 60/215,697, filed on Jun. 29, 2000.

(51) Int. Cl.
*G06G 7/50* (2006.01)
*G06G 7/60* (2006.01)
*G06V 1/40* (2006.01)

(52) U.S. Cl. .................... 703/9; 702/6; 703/2

(58) Field of Classification Search ............... 703/9, 703/2; 702/6, 50, 159; 137/2; 92/8; 716/20; 33/73; 174/69; 73/302

See application file for complete search history.

(56) References Cited

U.S. PATENT DOCUMENTS

| | | | |
|---|---|---|---|
| 3,029,018 A * | 4/1962 | Floyd, Jr. .................. | 703/9 |
| 3,302,710 A | 2/1967 | Odeh ...................... | 166/9 |
| 4,742,473 A * | 5/1988 | Shugar et al. ............. | 715/821 |
| 4,821,164 A | 4/1989 | Swanson | |
| 5,255,212 A | 10/1993 | Kondoh et al. | |
| 5,432,718 A | 7/1995 | Molvig et al. | |
| 5,553,009 A | 9/1996 | Meshkat et al. | |
| 5,572,634 A | 11/1996 | Duluk, Jr. | |

(Continued)

FOREIGN PATENT DOCUMENTS

EP    0 709 789 A2    5/1996

(Continued)

OTHER PUBLICATIONS

Ghosh, S., "Curvilinear Local Refinement", SPE 50633, SPE European Petroleum Conference, The Netherlands, Oct. 20-22, 1998.*

(Continued)

*Primary Examiner*—Kamini Shah
*Assistant Examiner*—Thomas H. Stevens
(74) *Attorney, Agent, or Firm*—Toler Schaffer, LLP

(57) ABSTRACT

A method and system for predicting the behavior of a physical system are disclosed. One embodiment of the method of this invention comprises the steps of creating an equation in a first coordinate system to model an aspect of the physical system; applying a coordinate transformation to the equation to transform the equation from the first coordinate system into a second coordinate system more closely representative of an analytical solution to the equation; solving the equation in the second coordinate system to obtain a solution; transforming the solution back to the first coordinate system; creating a second equation in the first coordinate system to model a second aspect of the physical system; solving the second equation in the first coordinate system to obtain a solution to the second equation; and combining the mapped solution to the first equation and the solution to the second equation in the first coordinate system to obtain a combined solution. One embodiment of the system of this invention comprises a computer-readable medium containing a plurality of instructions embodying the above method.

38 Claims, 3 Drawing Sheets

U.S. PATENT DOCUMENTS

| | | | |
|---|---|---|---|
| 5,604,911 A | 2/1997 | Ushiro | |
| 5,617,322 A | 4/1997 | Yokota | |
| 5,675,521 A | 10/1997 | Holzhauer et al. | |
| 5,699,271 A | 12/1997 | Sagawa et al. | |
| 5,710,726 A | 1/1998 | Rowney et al. | |
| 5,740,342 A | 4/1998 | Kocberber | |
| 5,754,181 A | 5/1998 | Amdursky et al. | |
| 5,828,003 A * | 10/1998 | Thomeer et al. | 174/69 |
| 5,891,131 A * | 4/1999 | Rajan et al. | 606/5 |
| 5,966,524 A | 10/1999 | Burnett et al. | |
| 5,999,187 A | 12/1999 | Dehmlow et al. | |
| 6,014,473 A * | 1/2000 | Hossack et al. | 382/294 |
| 6,018,497 A | 1/2000 | Gunasekera | |
| 6,028,607 A | 2/2000 | Chan | |
| 6,041,017 A * | 3/2000 | Goldsberry | 367/38 |
| 6,052,520 A | 4/2000 | Watts, III | |
| 6,054,992 A | 4/2000 | Gibson | |
| 6,064,810 A | 5/2000 | Raad et al. | |
| 6,070,125 A | 5/2000 | Murphy et al. | |
| 6,078,869 A * | 6/2000 | Gunasekera | 702/6 |
| 6,106,561 A * | 8/2000 | Farmer | 703/10 |
| 6,191,796 B1 | 2/2001 | Tarr | |
| 6,313,837 B1 | 11/2001 | Assa et al. | |
| 6,330,523 B1 * | 12/2001 | Kacyra et al. | 702/159 |
| 6,445,390 B1 | 9/2002 | Aftosmis et al. | |
| 6,448,788 B1 | 9/2002 | Meaney et al. | |
| 6,516,080 B1 | 2/2003 | Nur | |
| 6,552,724 B1 | 4/2003 | Marshall | |
| 6,587,104 B1 | 7/2003 | Hoppe | |
| 6,608,628 B1 | 8/2003 | Ross et al. | |
| 6,674,432 B1 | 1/2004 | Kennon et al. | |
| 6,695,765 B1 * | 2/2004 | Beebe et al. | 600/33 |
| 6,816,820 B1 | 11/2004 | Friedl et al. | |
| 2002/0032494 A1 | 3/2002 | Kennon et al. | |
| 2002/0032550 A1 | 3/2002 | Ward et al. | |
| 2002/0035453 A1 | 3/2002 | Pond, Jr. et al. | |
| 2002/0046014 A1 | 4/2002 | Kennon | |
| 2002/0067373 A1 | 6/2002 | Roe et al. | |
| 2002/0072883 A1 | 6/2002 | Lim et al. | |
| 2002/0082813 A1 | 6/2002 | Lim et al. | |

FOREIGN PATENT DOCUMENTS

| | | |
|---|---|---|
| EP | 0 801 364 B1 | 7/2003 |
| FR | 2775094 | 8/1999 |
| GB | 2326747 A | 12/1998 |
| WO | WO 99/40532 | 8/1999 |
| WO | WO 99/52048 | 10/1999 |
| WO | WO 99/57418 | 11/1999 |
| WO | WO 02/01251 A2 | 1/2002 |
| WO | WO 02/02901 A2 | 1/2002 |
| WO | WO 02/03101 A2 | 1/2002 |
| WO | WO 02/03103 A2 | 1/2002 |
| WO | WO 02/03262 A2 | 1/2002 |
| WO | WO 02/03263 A2 | 1/2002 |
| WO | WO 02/03264 A2 | 1/2002 |
| WO | WO 02/03265 A2 | 1/2002 |

OTHER PUBLICATIONS

Sharpe, H.N., "A New Adaptive Orthogonal Grid Generation Procedure for Reservoir Simulation", 65th Annual Technical Conference and Exhibition of the Society of Petroleum Engineers, New Orleans, LA, Sep. 23-26, 1990.*

Li et al., "Well-Bore Bottom Stress Concentration and Induced Core Fractures" AAPG Bulletin 1997. pp. 1909-1925.*

Kim et al., "Numerical Simulation of the Noordbergum Effect Resulting from Groundwater Pumping in the Layered Aquifer System" Elsevier Journal of Hydrology 1997 pp. 232-243.*

Verma et al., "A Control Volume Scheme for Flexible Grids in Reservoir Simulation" 1997 Society of Petroleum Engineers. pp. 215-227.*

U.S. Army, "Engineering and Design-Environment Engineering for Coastal Shore Protection—Appendix B Models" 1989, p. B-1 to B-30.*

Özdogan Yilmaz, "Seismic Data Processing", Society of Exploration Geophysics, Tulsa, OK, 1991, pp. 514-515.

Norris et al., "Modeling Fluid Flow Around Horizontal Wellbores", Proceedings: SPE Annual Technical Conference and Exhibition 1990 Part 4, New Orleans, LA, Sep. 23-26, 1990, vol. SIGMA, 1990, pp. 65-75.

International Search Report dated Mar. 11, 2002.

P.A. Forsyth et al., "Local Mesh Refinement and Modeling of Faults and Pinchouts", SPE Form Evaluation, Jun. 1986, vol. 1, No. 3, pp. 275-285. XP-002191830.

Y. Ding, et al., "Developement of Dynamic Local Grid Refinement in Reservoir Simulation", Proceedings of the 13th SPE Symposium on Reservoir Simulation, New Orleans, LA, Feb.-Mar. 1993, pp. 501-510. XP-002191831.

S. Verna, et al., "A Control Volume Scheme for Flexible Frids in Reservoir Simulation", Proceedings of the 1997 SPE Reservoir Simulation Symposium, Dallas, TX, Jun. 1997, pp. 215-227. XP-002191832.

S. Kocberber, et al., "An Automatic, Unstructured Control Volume Generation System for Geologically Complex Reservoirs", Proceedings of the 1997 SPE Reservoir Simulation Symposium, Dallas, TX, Jun. 1997, pp. 241-252. XP-002191833.

Y. Kuwauchi, et al., "Development and Applications of a Three-Dimentsional Voronoi-Based Fexible Grid Black Oil Reservoir Simulator", SPE Asia Specific Oil & Gas Congerence, Adelaide, Australia, Oct. 1996, pp. 1-12. XP-002191834.

R. Page, et al., "A Functional Program Describing a Simple Reservoir Model and Its Potential for Parallel Computation", Proceedings of the 1990 Symposium on Applied Computing, IEEE, Apr. 1990, pp. 85-91.

C. Giertsen, et al., "Volume Visulization of Sparse Irregular Meshes", Computer Graphics and Applications, IEEE, vol. 2, No. 2, Mar. 1992, pp. 40-48.

S. Ghosh, "Curvilinear Local Grid Refinement", SPE 50633, SPE European Petroleum Conference, The Netherlands, Oct. 20-22, 1998.

H. N. Sharpe, et al., "A New Adaptive Orthogonal Grid Generation Procedure for Reservoir Simulation" 65th Annual Technical Conference and Exhibition of the Society of Petroleum Engineers. New Orleans. LA. Sep. 23-26. 1990.

M. Wheeler, et al., "A Parallel Multiblock/Multidomain Approach for Reservoir Simulation", Proceedings of the 1999 15th Symposium on Reservoir Simulation, Houston, TX, Feb. 1999. XP-002188857.

D. Kahaner, et al., "An Expreimental Algorithm for N-Dimensional Adaptive Quadrature", ACM Transactions on Mathematical Software (TOMS), Mar. 1979, pp. 86-96.

Y. Ozdogan, "Seismic Data Processing", Society of Exploration Geophysics, Tulsa, OK, 1991, pp. 514-515.

S. Norris, et al., "Modeling Fluid Flow Around Horizontal Wellbores", Proceedings: SPE Annual Technical Conference and Exhibition 1990 Part 4, New Orleans, LA Sep. 23-26, 1990, vol. SIGMA, pp. 65-75.

P. Perrochet, "Finite Hyperelements: A 4D Geometrical Framework Using Coariant Baes and Metric Tensors" Communications in Numberical Methods in Engineering, Jun. 1995, UK, vol. 11, No. 6, pp. 525-534.

J.M.M. Regtien, et al., "Interactive Reservoir Simulation", Proceedings of the 13th Symposium on Reservoir Simulation, San Antonio, TX Feb. 12-15, pp. 545-552.

C. Buckalew, et al., "Oilfield Visulization on the PC Platform", 2000 SPE/AAPG Western Regional Meeting, Jun. 19-23, 2000, pp. 1-5.

E. Farkas, Linearization Techniques of Reservoir Simulation Equations: Fully Implicit Cases, Proceedigns of the 1997 SPE Reservoir Simulation Symposium, Dallas, Texas Jun. 8-11, 1997, pp. 87-95.

E. Farkas, Linearization Techniques of Reservoir Simulation Equations: Fully Implicit Cases, Richardson, Texas, Dec. 1998, vol. 3, No. 4, pp. 316-323.

P. Benedeck, Capacitances of Planar Multiconductor Configuration on a Dielectric Substrate by a Mixed Order Finite-Element Method, IEEE1974, p. 279-284.

Fu, et al., Time Integration Procedures for a Cyclic Thermoviscoplasticity Model for Pb-Sn solder applications, IEEE 1996, 403-413.

P. J. Zwart, et al., "Space-Time Meshing for Two-Dimensional Moving Boundary Problems", Proceedings of the Seventh International Meshing Roundtable, pp. 187-199, 1998.

S. L. Ho, et al., "Generation and Rotation of 3-D Finite Element Mesh for Skewed Rotor Induction Motors Using Extrusion Technique", IEEE Transactions on Magnetics, pp. 1266-1269, May 1999.

* cited by examiner

METHOD AND SYSTEM FOR COORDINATE TRANSFORMATION TO MODEL RADIAL FLOW NEAR A SINGULARITY

RELATED INFORMATION

This application claims priority under 35 U.S.C. 119(e) to provisional patent application No. 60/215,697, filed Jun. 29, 2000, entitled "Method and System for Oil Reservoir Simulation and Modeling," which is hereby fully incorporated by reference.

TECHNICAL FIELD OF THE INVENTION

This invention relates generally to methods and systems for modeling physical systems using Finite Element analysis and, more specifically, to methods and systems for modeling physical systems near a singularity. Even more particularly, this invention relates to a method and system for coordinate transformation to model radial flow near a singularity.

BACKGROUND OF THE INVENTION

Physical systems can be modeled mathematically to simulate their behavior under different conditions. A wide variety of means exist to model physical systems, ranging from the very simplistic to the extremely complicated. One of the more complicated means to model physical systems is through the use of finite element analysis. As the name implies, finite element analysis involves the representation of individual, finite elements of a physical system in a mathematical model and the solution of this model in the presence of a predetermined set of boundary conditions.

In finite element modeling, the region that is to be analyzed is broken up into sub-regions called elements. This process of dividing the region into sub-regions may be referred to as discretization or mesh generation. The region is represented by functions defined over each element. This generates a number of local functions that are much simpler than those which would be required to represent the entire region. The next step is to analyze the response for each element. This is accomplished by building a matrix that defines the interaction properties of the various elements within the region and a vector that defines the forces acting on each element in the structure. Once all the element matrices and vectors have been created, they are combined into a structure matrix equation. This equation relates nodal responses for the entire structure to nodal forces. After applying boundary conditions, the structure matrix equation can be solved to obtain unknown nodal responses. Intra-element responses can be interpolated from nodal values using the functions which were defined over each element.

As indicated above, finite element modeling involves the creation of a mesh of finite elements. The elements are defined by nodes within the problem space. The nodes are simply points in space. The lines between the nodes are referred to as "edges." The mesh is typically a structured mesh. In other words, the mesh is defined in three dimensions so that the elements within the problem space are hexahedrons. For example, they may be cubes or rectangular prisms. (Equivalently, in two dimensional problems, the elements would be rectangles—see FIG. 1 for an illustration of these elements.) The edges of the hexahedrons are coincident with the edges between the nodes of the mesh. In a simple model, the nodes of the mesh may be regularly spaced to define cubic elements. It is not necessary, however, for the nodes to be evenly spaced in all finite element models. A variety of different sizes and shapes of hexahedral elements can be defined within a single mesh.

However, mathematical models to simulate the behavior of physical systems can be both time consuming and complex to create. In particular, finite element analysis problems in multiple dimensions (for example, the four dimensions of space and time) are almost intractable to solve using non-computer-aided computational techniques. These types of problems are so complex that they must be performed with computer assistance. In particular, the difficulty of solving the mathematical equations used to model a physical system increases almost exponentially, in terms of the actual computations that must be performed, as the number of dimensions that the problem encompasses increases.

One method of solving the equations involved in mathematical modeling of physical systems, such as oil field reservoirs, involves the use of simulators that can create a model of the physical system based on user inputs of both equations, and variables within the equations, that describe the system. Typically, analysts skilled in both high-level mathematics (to generate the complex equations needed), and in high-level programming (to generate the necessary code from the mathematical formulations) are required. Alternatively, teams of specialized mathematicians and programmers can be used to analyze a problem, formulate the mathematical equations, and write the corresponding code by hand. One such method and system for creating simulators to model physical systems is disclosed in related U.S. patent application Ser. No. 09/419,717, entitled "METHOD AND SYSTEM FOR GENERATING SOFTWARE CODE USING A SYMBOLIC LANGUAGE TRANSLATOR," filed on Oct. 14, 1999 now U.S. Pat. No. 6,633,837. This application is hereby incorporated by reference in its entirety.

However, even the models obtained with these state-of-the-art simulators do not always adequately represent the physical system being modeled such that accurate solutions can be obtained at certain critical points. For example, prior art methods and systems for solving the equations used to model a physical system typically use linear approximations and other averaging techniques (that make various assumptions that may not be true at certain points in the system). Also, these prior art methods and systems typically require a large number of nodes (solution points) to accurately model a system. Solving the equations that represent the system at each of these nodes requires a great deal of time and computational power.

Further, certain physical characteristics of a system being modeled do not lend themselves well to modeling in a Cartesian coordinate system. In particular, the pressure profile in the vicinity of a well tapping into an oil field reservoir is highly non-linear in Cartesian coordinates. Therefore, using linear elements in the finite element analysis may introduce significant interpolation errors. This is especially true when a coarse mesh (as known to those in the art), and therefore large linear elements, is used in Cartesian space. If the modeling is performed using only the X,Y,Z coordinate (Cartesian coordinate) system, then if the temporal (time) dimensional extrusion used in the system modeling is irregular (i.e., the system model is not uniform), then the solution to the problem may oscillate.

Modeling of a physical system is a predictive exercise. For example, when generating a model of the pressure distribution inside of an oil field reservoir, the intent is to generate a tool that can be used to determine the pressure distribution, under a certain set of relevant conditions, to be able to predict the effect on the system when those conditions are changed. The model must therefore be accurate within the range of conditions of interest.

The pressure distribution in an oil field reservoir has been found to be non-linear in a Cartesian coordinate system (in fact, it is a logarithm), especially in the vicinity of a well. The pressure is thus typically greater far out from the well and then drops logarithmically as the distance from the well bore decreases. Modeling such a system accurately, using a Cartesian coordinate system, thus requires a large number of nodes. A linear approximation is insufficient, because on the logarithmic pressure curve the values will change too greatly between nodes. Using a Cartesian coordinate system can thus result in oscillations and inaccuracies in the solution. Without an appropriate approximation, predictive behavior is uncertain and the model fails.

Standard finite element analysis techniques applied to the Cartesian coordinate space are thus inadequate for modeling radial flow near a singularity such as the near-well region of an oil field reservoir. Boundary conditions representing fluid flows into, or out of, a well are inaccurate near such a singularity unless a very fine spatial mesh requiring a large number of nodes is generated. Such a mesh requires nodes spaced at very small increments to be able to accurately predict results. The time and computational resources needed to obtain a solution in this matter also increase as the node count increases.

SUMMARY OF THE INVENTION

Therefore, a need exists for a coordinate transformation method and system for modeling radial flow near a singularity that can transform the equations used to model a physical system from the Cartesian coordinate system to a coordinate system in which the solutions to the transformed equations are linear for a quantity of interest, such as the pressure distribution within a reservoir.

A further need exists for a coordinate transformation method and system for modeling radial flow near a singularity that can yield at least as accurate solutions as prior art finite element analysis techniques applied in a Cartesian coordinate space while requiring a lesser number of nodes to model a system.

Still further, a need exists for a coordinate transformation method and system for modeling radial flow near a singularity that can provide greater modeling accuracy and computational efficiency than currently existing finite element techniques applied in a Cartesian coordinate space.

Even further, a need exists for a coordinate transformation method and system for modeling radial flow near a singularity that can be used together with a non-transformed Cartesian coordinate model to provide accurate solutions when modeling a physical system near a singularity and in the regions spreading outward from the singularity.

In accordance with the present invention, a coordinate transformation method and system for modeling radial flow near a singularity are provided that substantially eliminate or reduce the disadvantages and problems associated with currently existing finite element analysis systems and methods applied in a Cartesian coordinate space. In particular, the present invention provides a method and system for predicting the behavior of a physical system. One embodiment of the method of this invention comprises the steps of creating an equation in a first coordinate system to model an aspect of the physical system; applying a coordinate transformation to the equation to transform the equation from the first coordinate system into a second coordinate system more closely representative of an analytical solution to the equation; solving the equation in the second coordinate system to obtain a solution; transforming the solution back to the first coordinate system; creating a second equation in the first coordinate system to model a second aspect of the physical system; solving the second equation in the first coordinate system to obtain a solution to the second equation; and combining the mapped solution to the first equation and the solution to the second equation in the first coordinate system to obtain a combined solution. One embodiment of the system of this invention comprises a computer-readable medium containing a plurality of instructions embodying the above method.

The present invention provides an important technical advantage of a coordinate transformation method and system for modeling radial flow near a singularity that can be used to transform the equations used to model a physical system from the Cartesian coordinate system to a coordinate system in which the solutions to the transformed equations are linear for a quantity of interest, such as the pressure distribution within a reservoir.

Further, the present invention provides an important technical advantage of a coordinate transformation method and system for modeling radial flow near a singularity that can yield as accurate solutions as prior art finite element analysis techniques applied in a Cartesian coordinate space while requiring a lesser number of nodes to model a system.

Even further, the present invention provides an important technical advantage of a coordinate transformation method and system for modeling radial flow near a singularity that provides greater modeling accuracy and computational efficiency than currently existing finite element analysis techniques applied in a Cartesian coordinate space.

Still further, the present invention provides an important technical advantage of a coordinate transformation method and system for modeling radial flow near a singularity that can be used together with a non-transformed Cartesian coordinate model to provide accurate solutions near a singularity and in the regions spreading outward from the singularity.

BRIEF DESCRIPTION OF THE DRAWINGS

A more complete understanding of the present invention and the advantages thereof may be acquired by referring to the following description, taken in conjunction with the accompanying drawings in which like reference numbers indicate like features and wherein.

DETAILED DESCRIPTION OF THE INVENTION

Preferred embodiments of the present invention are illustrated in the FIGURES, like numerals being used to refer to like and corresponding parts of the various drawings.

The various embodiments of the present invention provide a coordinate transformation method and system for modeling radial flow near a singularity that is more flexible, more computationally efficient, more accurate, and less dependent on having a large number of nodes to model the system than prior art finite element analysis methods and systems. In particular, the embodiments of the present invention provide the capability for taking an equation representing a system to be modeled (or some aspect of the system to be modeled) in the Cartesian coordinate system and performing a transformation to represent the equation in some other coordinate system in which the solution is in a more usable form.

The embodiments of the present invention can be used to perform a mapping from one coordinate space to the other to, for example, provide a representation in the new coordinate space that yields a linear solution. The solution to an equation that in the Cartesian coordinate system is non-linear, such as the pressure distribution in an oil field reservoir, can thus be placed in a map to a coordinate system in which an accurate predictive model that is linear can be generated. Because the non-linear solution is mapped into a coordinate system in which the solution is linear, accurate solutions can be obtained using a smaller number of data nodes (solution points at which various parameters must be known to solve the equation(s) modeling a system).

The embodiments of the method and system of the present invention can use a combination of Cartesian operators and non-Cartesian operators to generate accurate and usable solutions for equations representing a physical system. Cartesian operators are used to solve for a solution of the equations in the regions of the physical system not near a singularity. Non-Cartesian operators are transformed into a new coordinate system and solved in the transform space. The non-Cartesian solutions to the modeling equations are then mapped back into the Cartesian coordinate system.

The physical system being modeled (for example, the region in the vicinity of a well bore of an oil field reservoir) can thus be represented more accurately using one set of operators near a singularity (e.g., the well bore) and a different set of operators in the regions further away from the well bore. In the regions very near the well bore, for example, to a radius of about 50 to 100 feet from the well bore (singularity), non-Cartesian operators can be used with the radial transformation applied to them. The portions of the physical system extending beyond this distance can be modeled using the Cartesian operators. The distances away from a singularity at which the Cartesian and non-Cartesian operators are used can be set as required for a particular application.

Figure 1:
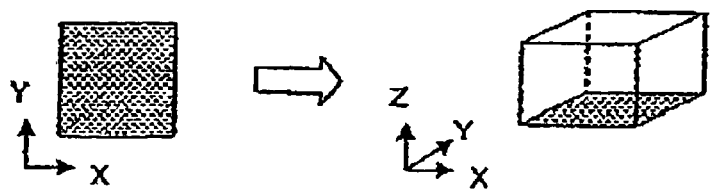
FIG. 1 is an illustration of the rectangular and hexahedral elements that comprise structured finite element meshes in the prior art.
Figure 2:
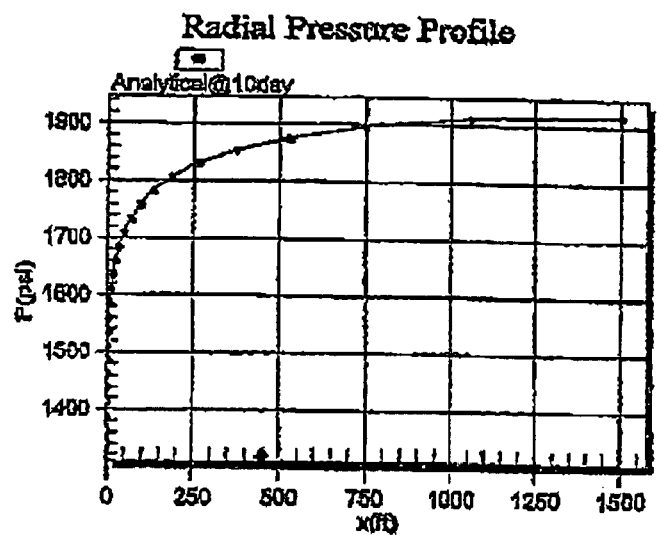
FIG. 2 shows pressure distribution in the vicinity of a producing well, plotted against radial distance from the well.

The combination of Cartesian and non-Cartesian operators yields a good solution throughout the physical system (for example, an oil field reservoir) being modeled and can provide greater accuracy in a critical area of interest, e.g., a singularity such as a well bore. As can be seen in the example of FIG. 2, the radial pressure near a well bore can change greatly over small distances, but flattens out and can be linearly approximated starting several hundred feet out from the well bore. In the critical area of interest near the well bore, applying a coordinate transformation in accordance with the embodiments of this invention can yield greater accuracy using less nodes and less computational resources than with prior art finite element analysis techniques. In the regions several hundred feet out from the well bore, the relationship between pressure and distance varies much less rapidly and can be more easily approximated using standard techniques. To obtain the same accuracy as possible with the embodiments of the method and system of the present invention, prior art systems required a much greater number of data nodes in the near-well region to provide an accurate model. This is due to the rapidly changing pressure profile over short distances of this near-well region.

Under certain circumstances, the radial coordinate transformation provided by the embodiments of the present invention can provide an exact solution. For example, if an oil field reservoir being modeled is homogeneous, it may only take two nodes to calculate a solution out to any radius. Intermediate nodes are not necessary, and the node count required to obtain an accurate solution is greatly reduced, resulting in greatly increased computational speed and in a reduction in computational resources required to obtain a solution. In such a case, the coordinate transformation operators can be used to obtain a solution throughout the oil field reservoir model, without the need for the Cartesian operators in the regions further from the well bore (singularity).

A lack of resolution in accuracy in the near-well region can also arise when using Cartesian discretization in the near-well region. A very high mesh resolution, and therefore a large node count, is necessary to achieve sufficient accuracy when compared with a reference analytical solution when using the Cartesian operators. The embodiments of the method and system for coordinate transformation of the present invention can greatly reduce or eliminate both the lack of resolution in the accuracy in the near-well region and the oscillations due to irregular time extrusions.

Figure 3:
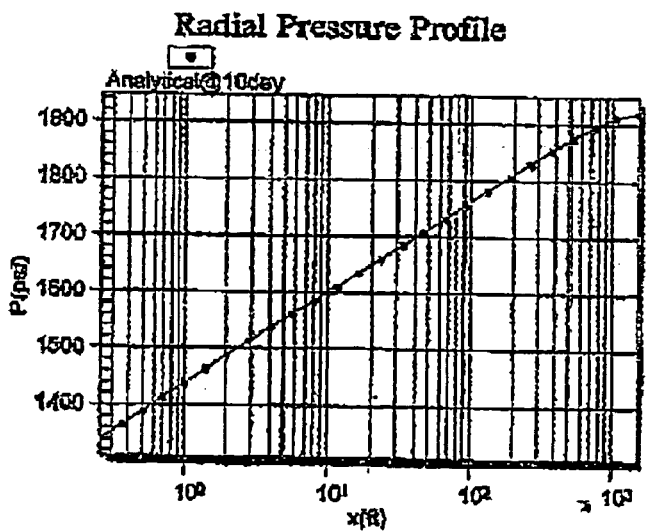
FIG. 3 illustrates pressure distribution in the vicinity of a producing well, plotted against the natural logarithm of the distance from the well.

The embodiments of the method and system of this invention take into account that the flow field around the well in an oil field reservoir is essentially radial. The pressure profile is highly non-linear with respect to distance from the well-bore and is poorly approximated by linear elements. Radial flow implies that pressure varies linearly against the log of radial distance. The embodiments of the present invention take advantage of this relationship to significantly improve the pressure field interpolation. This is illustrated in FIGS. 2 and 3, which show a radial pressure profile versus distance from a well bore in both a Cartesian coordinate system (FIG. 2) and using the transform operators of the embodiments of the present invention (FIG. 3).

A basis for the coordinate transformation method of the embodiments of the present invention is that steady state radial flow from a reservoir towards a singularity (e.g., a well bore) is described by the following relationship:

$$Q = \frac{2\pi}{\ln(r/r_w)}(p - p_w) \quad \text{(EQN. 1)}$$

In Equation 1, "Q" is the flow rate, "p" is the pressure at a reference radius "r" and the subscript "w" denotes the well bore (singularity). By rearranging Equation 1, the pressure distribution for a given flow rate "Q" and well pressure "$p_w$" is found to be:

$$p = p_w + \frac{Q\ln(r/r_w)}{2\pi} \quad \text{(EQN. 2)}$$

The relationship of Equation 2 indicates that a plot of pressures versus the natural log of "r" will yield a linear relationship. Equations 1 and 2 assume unit conductivity in the reservoir. FIG. 2 is a plot of the radial pressure profile of a reservoir in Cartesian coordinates. As can be seen in FIG. 2, pressure falls off rapidly near the well bore (the first several hundred feet out from the well). Pressure varies much less rapidly the greater the distance from the well bore and then tends to flatten out. The same data plotted on a logarithmic horizontal axis yields a straight line relationship, as shown in FIG. 3. FIG. 3 demonstrates that steady state radial flow implies that pressure varies linearly with the log of radial distance from a well bore.

Because the pressure profile for an oil reservoir is highly non-linear in Cartesian coordinates in the vicinity of the well bore (e.g., for distances less than two hundred fifty feet in the example shown in FIG. 2), using linear elements in the finite element analysis may introduce significant interpolation errors. This is especially true when a coarse mesh, and therefore large linear elements, is used in Cartesian space. The linear relationship between the radial pressure distribution and the log of radial distance is therefore a basis for performing the coordinate transform. By transforming from the Cartesian (x, y, z) coordinates into a modified form of radial coordinates (s, θ, z) where:

$$s = \ln(r) \quad \text{(EQN. 3)}$$

The embodiments of the method and system of this invention can take advantage of the fact that, in the region where radial flow is predominant, pressure varies linearly with "s". Therefore, when linear elements are used, and when the nodal values are exact, there will be no interpolation error.

The following equations and explanation provide more details on the embodiments of the coordinate transformation method and system of this invention, as applied to the mass conservation equation for single-phase flow. These equations can be used to describe radial fluid flow near a singularity, such as a well bore. The continuity equation for single-phase flow is a diffusivity equation of the form:

$$\frac{\partial p}{\partial t} - \nabla^2 p = 0 \quad \text{(EQN. 4)}$$

The Laplacian operation ($\nabla^2 p$, in radial coordinate form, is:

$$\frac{\partial^2 p}{\partial s^2} = \frac{1}{r}\frac{\partial}{\partial r}\left(r\frac{\partial p}{\partial r}\right) + \frac{1}{r^2}\frac{\partial^2 p}{\partial \vartheta} + \frac{\partial^2 p}{\partial z^2} \quad \text{(EQN. 5)}$$

Applying the transform s=ln(r) the differentials can be written as:

$$\frac{\partial}{\partial r} = \text{Exp}[-s]\frac{\partial}{\partial s} \quad \text{(EQN. 6)}$$

The continuity equation can be rearranged as:

$$\frac{\partial p}{\partial t} - \text{Exp}[-2s]\left(\frac{\partial^2 p}{\partial s^2} + \frac{\partial^2 p}{\partial \vartheta^2}\right) - \frac{\partial^2 p}{\partial z^2} = 0 \quad \text{(EQN. 7)}$$

In applying the transformation to the one-phase black-oil equation, permeability anisotropy is accounted for by properly accounting for the cross terms introduced by the transform. Given a 3×3 permeability tensor, K, it is transformed to radial coordinate form by the following expression.

$$K_r = RKR^T$$

$$R = \begin{bmatrix} \cos\theta & \sin\theta & 0 \\ -\sin\theta & \cos\theta & 0 \\ 0 & 0 & 1 \end{bmatrix}$$

The embodiments of the coordinate transformation to model radial flow near a singularity of this invention can thus be used to significantly improve the modeling of one-phase fluid flow.

Figure 4:
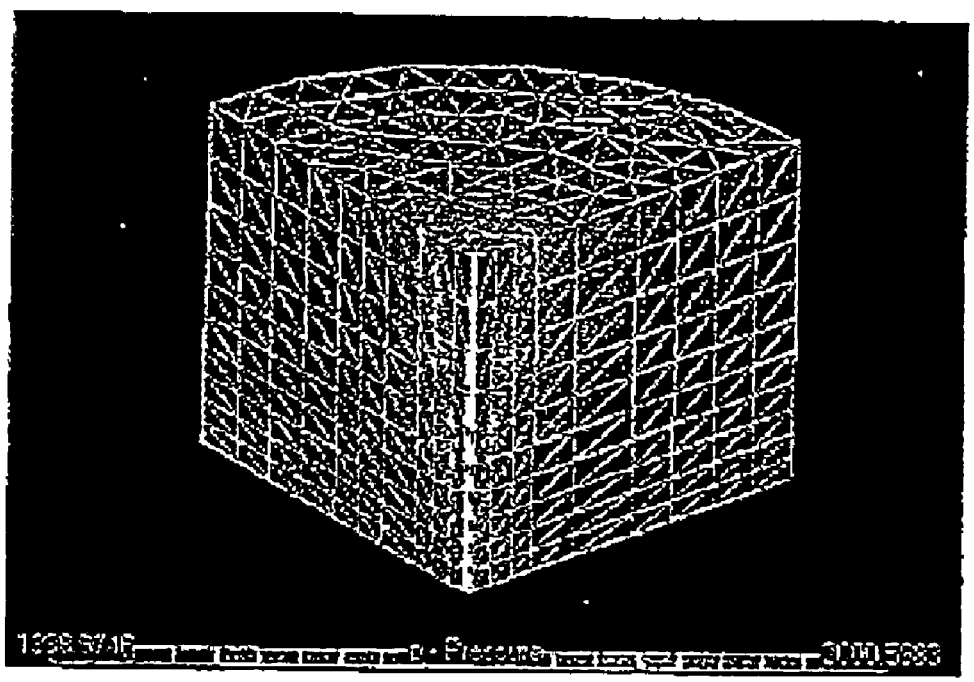
FIGS. 4 and 5 illustrate pressure distribution in the vicinity of a producing well, computed using the embodiments of the radial transformation method of the present invention.
Figure 5:
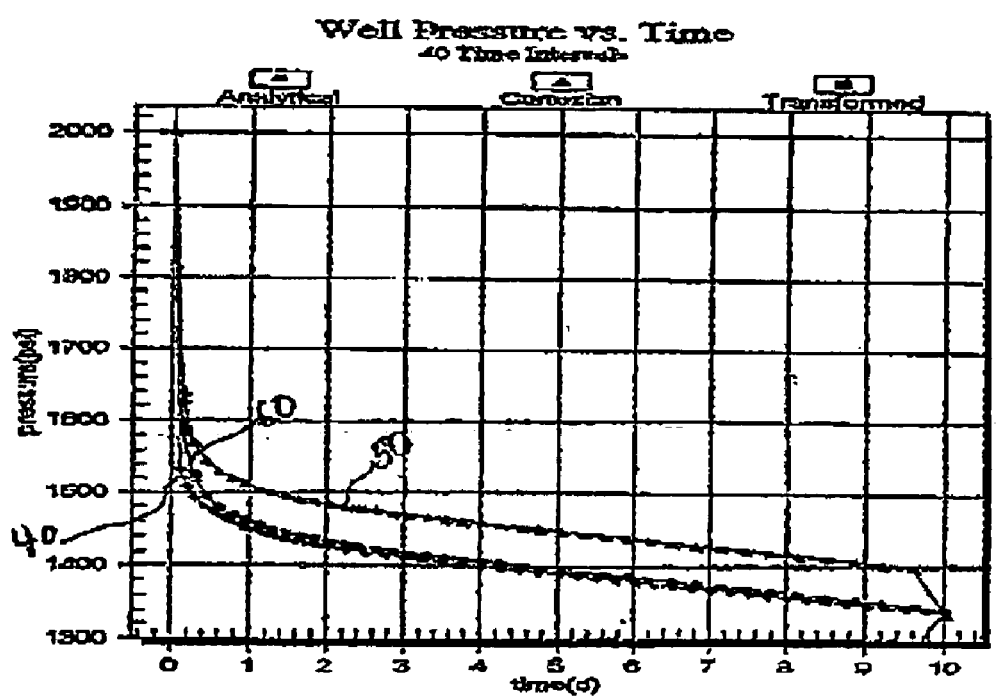

FIGS. 4 and 5 are graphs illustrating the radial fluid flow characteristics around a singularity using the coordinate transformation model of the embodiments of the present invention. The system modeled in this case, as shown in FIG. 4, is a one-quarter segment of a well in the center of a circular reservoir. The reservoir radius is 1,500 feet, and a relatively coarse mesh is used in the vicinity of the well (singularity) in the foreground of FIG. 4. The inner radius is equal to 0.25 feet, the outer radius is 100 feet, with four intermediate computation nodes between these two radii. Boundary conditions are that the reservoir is initially at 2,000 psi and a constant withdrawal is imposed at the well at all times (from start to finish at ten days).

FIG. 5 is a graph of well pressure versus time, showing the analytical solution 40, Cartesian operator solution 50, and a transform coordinate solution 60. The plot shown in FIG. 5 comprises forty time intervals, which can help to improve the overall accuracy of the solution (accuracy can improve with the number of time intervals used). As can be seen in FIG. 5, accumulated computational errors toward the end of the computed time show up very clearly in the Cartesian operator solution 50, but not in the radial (transform) coordinate solution 60. The transform coordinate solution 60 also tracks much more closely the observed analytical solution 40.

Figure 6:
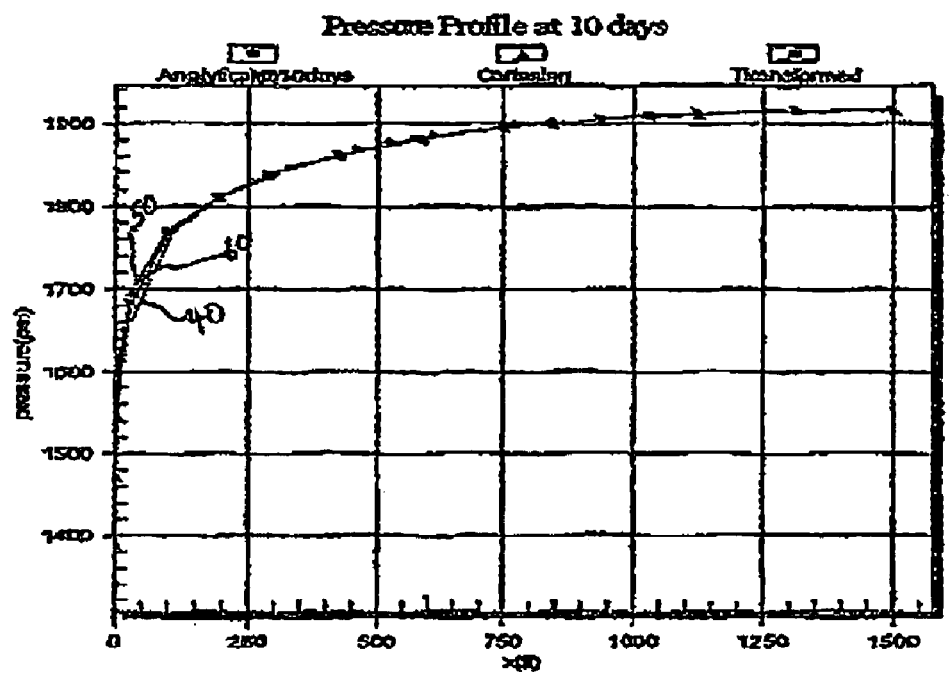
FIG. 6 illustrates pressure distribution in the vicinity of a producing well, plotted as a function of radial distance from the well, computed using (i) analytical solutions, (ii) Cartesian coordinates, and (iii) an embodiment of the radial transformation method of the present invention.
Figure 7:
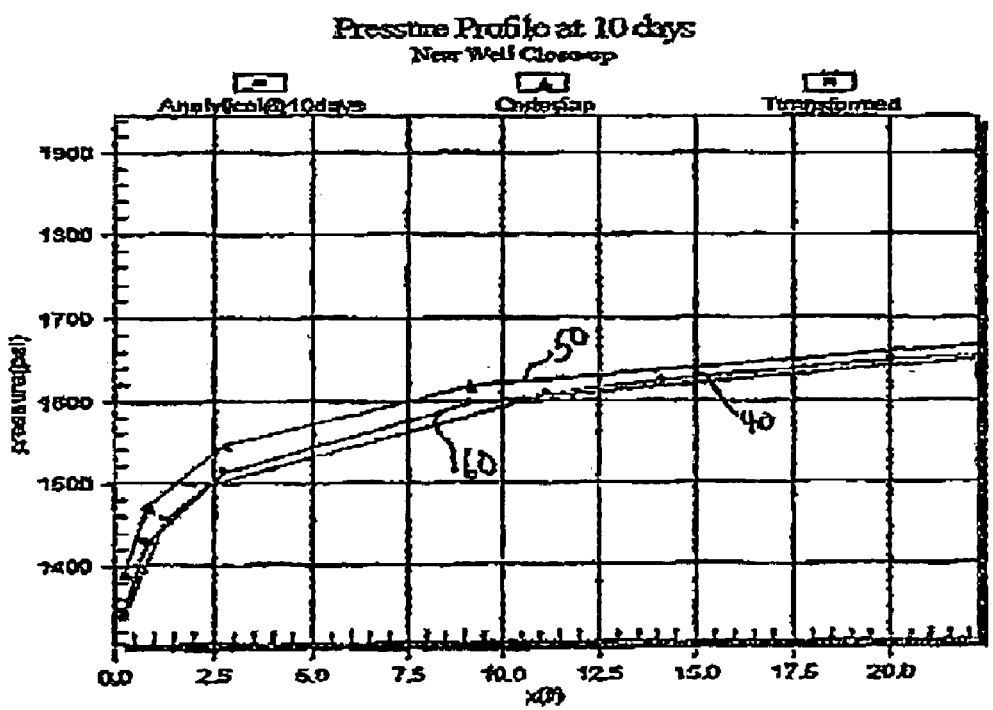
FIG. 7 is an enlarged graph of the same solutions shown in FIG. 6, showing details of the pressure distribution out to a distance of 20 feet.

FIGS. 6 and 7 show another example of solutions obtained using embodiments of the coordinate transformation method and system of this invention. The model used to obtain the solutions shown in FIGS. 6 and 7 is a one-quarter segment of a well in the center of a circular reservoir model. The reservoir radius is 1,500 feet, and a relatively coarse mesh is used in the completion model, with an inner radius of 0.25 feet, an outer radius of 100 feet, and having four intermediate computational nodes between these radii. As in the example of FIGS. 4 and 5, the reservoir is initially at 2,000 psi and a constant withdrawal is imposed at the well at all times (0–10 days).

As can be seen in FIG. 6, for radial distances beyond approximately 200 feet, the Cartesian operator solution 50, and the transform coordinate solution 60 track fairly closely to the analytical solution 40 for the pressure profile over the ten-day period. However, as shown in FIG. 7, the near-well (here, out to 25 feet radial distance from the well bore) data clearly shows that the transform coordinate solution 60 is much more accurate in the near-well regions than the Cartesian operator solution 50. FIG. 7 is an expanded graph of the same solutions shown in FIG. 6, for the near-well regions of 0.25 feet out to approximately 25 feet. In this near-well region, the transform coordinate solution 60 is a much better approximation of the observed analytical solution 40.

Referring back to FIGS. 2 and 3, it can be seen that if any two points from FIG. 2 are taken as one element, a large number of these points are necessary to create an approximation of the curve. By contrast, in the coordinate transformation space shown in FIG. 3, the solution is linear and intermediate points are not necessary. Any two points can be used to pick up all variations and give exact solutions.

The coordinate transformation of various embodiments of the present invention comprises a mathematical mapping from one coordinate space to another coordinate space and can be implemented as computer executable software instructions stored in memory within a computing device. The memory can be RAM or ROM, or a fixed media such as a hard drive or magnetic media as known to those in the art. The computing device can be any computer capable of executing the software instructions, for example, a Windows UNIX or Linux based PC, or a Macintosh. The embodiments of the method and system of this invention can be described as a method for transforming coordinates to produce highly accurate simulations of reservoirs or other physical systems, in particular, near a point of interest such as a singularity (e.g., a well bore).

Embodiments of the method and system of the present invention can be applied beyond the singularity of a well bore. Embodiments of this invention can be used to model and solve for properties of horizontal wells, fractures and/or faults. Embodiments of this invention are contemplated to be used in any situation where there is some potential for introducing a transformation that more closely represents the behavior of an analytical solution. The transformation of the embodiments of the present invention is analogous to a case in solid mechanics for the modeling of heat transfer.

Parameters other than pressure profiles can be modeled using the embodiments of the method and system of this invention. The embodiments of this invention comprise a method for modeling singularities of various types, with applications in many different industries. For example, point loads, temperature distributions, and heat sinks can be modeled using the embodiments of this invention. A reservoir could, for example, instead be imagined to be a metal plate, with a heat source applied, such as a flame or a laser beam, to heat it up. Mathematically, this situation is identical to modeling of a pressure profile in a reservoir. Any type of singularity can thus be modeled using embodiments of the method and system of this invention.

The embodiments of the method and system of this invention can provide faster, less computationally intense, and more accurate modeling and solutions than previous methods and systems for modeling physical systems near a singularity in that, unlike prior art methods and systems, they do not just apply standard finite element techniques in a Cartesian coordinate space. Instead, embodiments of the present invention apply coordinate transformation to the computational space. Transformation is applied and computation performed, and the results obtained are still in a Cartesian coordinate space. As far as the user is concerned, the method of the embodiments of the present invention is transparent.

The embodiments of the method and system of this invention can be implemented within a user interface such as that disclosed in related U.S. Patent Application Publication No. 2002/0067373 entitled "SYSTEM AND METHOD FOR DEFINING AND DISPLAYING A RESERVOIR MODEL" filed on Jun. 29, 2001 (the "Blitzer Application"). With the interface disclosed in the Blitzer application, for example, an oilfield engineer could specify the model parameters necessary to calculate the quantity that they are interested in, and the embodiments of this invention can perform the calculations in a manner transparent to the oilfield engineer.

The embodiments of the method and system of this invention can be used to substantially overcome the inaccuracies of standard finite element analysis techniques when performing computations using a type of boundary condition representing the input or withdrawal of a physical quantity (for example, fluid or heat) from a singularity point. The embodiments of the methods of this invention can comprise a method for performing a coordinate transformation in a computational space for more accurately calculating conditions around a singularity in a physical model, for example, of a reservoir or other physical system.

Various embodiments of the method of this invention can be implemented in software and can be accessed through a user interface, such as the interface of the related Blitzer application, and can perform transformations in a method transparent to a user. These embodiments may include software or formal applications that embody methods such as those described herein, as well as computer readable media containing such applications and computers or other data processing systems that are configured to perform the described methods. Features of various embodiments of the present invention include transparent operation to the user, and the capability of allowing a user to set boundary conditions and variables of parameters that describe a system of interest.

An advantage of the embodiments of the method of the present invention is that, unlike in traditional approaches for obtaining a finite element analysis solution near a singularity, fewer nodes are necessary to get the same or better accuracy. Previous methods and systems require specification of a fine spatial mesh around the singularity in order to obtain the same degree of accuracy possible with the embodiments of this invention. The embodiments of this invention thus permit using a coarser mesh without sacrificing accuracy over the prior art methods. Prior art methods, for example, might require 50 nodes to be specified for the 6" to 20' radial distance out from a singularity to obtain a useful solution. Using the coordinate transformation method of the embodiments of this invention, nodes can instead be specified with much greater radial distance between them, for example, 10' to 20' between nodes (or even greater distances). In fact, some embodiments of the coordinate transformation method of this invention can use nodes spaced 50' apart and still get as accurate a resolution as prior art methods where many more nodes must be specified between 6" and 50' out.

The embodiments of the method and system of this invention work particularly well in the case of an isotropic system in which conductance in all directions is identical. An anisotropic system, where permeability (conductance) in the X and Y direction might be different, results in slightly less accurate solutions. Useable solutions are still possible in an anisotropic or heterogeneous system, but there may be extreme cases where the X direction permeability (conductance) may be, for example, 1,000 times larger than the permeability in the Y direction, in which case the coordinate transformation solution of the embodiments of this invention can introduce a significant error.

Embodiments of the coordinate transformation method and system of this invention provide the ability to transform the equations necessary to solve a system to a form that looks Cartesian. Basically, the coordinate space is transformed such that it is very well represented by the finite element approximation. This is different from prior art techniques where an attempt is made to still use the Cartesian equations, but to somehow embed a singularity into the finite element space. The embodiments of the method of this invention provide a technique that fixes the singularity (or removes the singularity) before the finite element method is ever applied to it, as opposed to trying to fix the finite element method by changing the way it operates. The underlying finite element analysis still exists on top of the transformation of the embodiments of the method of the present invention.

Although the present invention has been described in detail herein with reference to the illustrative embodiments, it should be understood that the description is by way of example only and is not to be construed in a limiting sense. It is to be further understood, therefore, that numerous changes in the details of the embodiments of this invention and additional embodiments of this invention will be apparent to, and may be made by, persons of ordinary skill in the art having reference to this description. It is contemplated that all such changes and additional embodiments are within the spirit and true scope of this invention as claimed below.

What is claimed is:

1. A method of representing a physical fluid reservoir using a computational system, said method comprising:
   providing a finite element representation of a feature of said physical fluid reservoir in a first coordinate system, said finite element representation associated with a fluid flow characteristic of fluid within said physical fluid reservoir;
   applying a coordinate transformation to said finite element representation for transforming said finite element representation from said first coordinate system into a second coordinate system;
   generating through finite element analysis a fluid flow representation in said second coordinate system based on said transformed finite element representation, said fluid flow representation providing a substantially linear representation of said fluid flow characteristic with respect to said second coordinate system; and
   displaying said fluid flow representation in a graphical user interface of said computational system.

2. The method of claim 1, wherein providing said finite element representation of said physical fluid reservoir comprises generating a finite element mesh representative of said physical fluid reservoir.

3. The method of claim 1, wherein said first coordinate system is a Cartesian coordinate system.

4. The method of claim 1, wherein said second coordinate system is a modified radial coordinate system.

5. The method of claim 4, wherein said modified radial coordinate system comprises the coordinates (s, θ, z), wherein s=ln(r).

6. The method of claim 1, wherein said feature of said physical fluid reservoir is a well bore.

7. The method of claim 1, wherein said feature of said physical fluid reservoir is a singularity.

8. The method of claim 7, wherein said singularity is a well bore.

9. The method of claim 1, wherein said fluid flow characteristic is pressure.

10. The method of claim 1, wherein said physical fluid reservoir comprises a fracture or fault.

11. The method of claim 1, further comprising the steps of:
    providing a second finite element representation in said first coordinate system to model a second feature of said physical fluid reservoir;
    generating a second fluid flow representation in said first coordinate system;
    transforming said fluid flow representation to said first coordinate system; and
    combining said transformed fluid flow representation and said second fluid flow representation in said first coordinate system to obtain a combined representation.

12. The method of claim 1, wherein transforming said fluid flow representation comprises mapping from said first coordinate system to said second coordinate system.

13. The method of claim 1, wherein said fluid flow representation represents radial fluid flow near a singularity.

14. The method of claim 13, wherein said singularity is a well bore in said physical fluid reservoir.

15. The method of claim 1, wherein applying said coordinate transformation is performed via computer executable software instructions.

16. A computer-readable medium containing a plurality of instructions embodying a method of representing a physical fluid reservoir using a computational system, said method comprising:
    providing a finite element representation of a feature of said physical fluid reservoir in a first coordinate system, said finite element representation associated with a fluid flow characteristic of fluid within said physical fluid reservoir;
    applying a coordinate transformation to said finite element representation for transforming said finite element representation from said first coordinate system into a second coordinate system;
    generating through finite element analysis a fluid flow representation in said second coordinate system based on said transformed finite element representation, said fluid flow representation providing a substantially linear representation of said fluid flow characteristic with respect to said second coordinate system; and
    displaying said fluid flow representation in a user interface of said computational system.

17. The computer-readable medium of claim 16, wherein providing said finite element representation of said physical fluid reservoir comprises generating a finite element mesh representative of said physical fluid reservoir.

18. The computer-readable medium of claim 16, wherein said first coordinate system is a Cartesian coordinate system.

19. The computer-readable medium of claim 16, wherein said second coordinate system is a modified radial coordinate system.

20. The computer-readable medium of claim 19, wherein said modified radial system comprises the coordinates (s, θ, z), wherein s=ln(r).

21. The computer-readable medium of claim 16, wherein said feature of said physical fluid reservoir is a well bore.

22. The computer-readable medium of claim 16, wherein said feature of said physical fluid reservoir is a singularity.

23. The computer-readable medium of claim 22, wherein said singularity is a well bore.

24. The computer-readable medium of claim 16, wherein said fluid flow characteristic is pressure.

25. The computer-readable medium of claim 16, wherein said physical fluid reservoir comprises a fracture or fault.

26. The computer-readable medium of claim 16, wherein said method further comprises:
providing a second finite element representation in said first coordinate system to model a second feature of said physical fluid reservoir;
generating a second fluid flow representation in said first coordinate system;
transforming said fluid flow representation to said first coordinate system; and
combining said transformed fluid flow representation and said second fluid flow representation in said first coordinate system to obtain a combined representation.

27. The computer-readable medium of claim 16, wherein transforming said fluid flow representation comprises mapping from said first coordinate system to said second coordinate system.

28. The computer-readable medium of claim 16, wherein said fluid flow representation represents radial fluid flow near a singularity.

29. The computer-readable medium of claim 28, wherein said singularity is a well bore in said physical fluid reservoir.

30. The computer-readable medium of claim 16, wherein said method is implemented using a graphical user interface.

31. A method of representing a physical fluid reservoir using a computational system, the method comprising:
providing a first finite element representation of feature of said physical fluid reservoir in a first coordinate system, said first finite element representation associated with a fluid flow characteristic of fluid within said physical fluid reservoir;
mapping said first finite element representation for transforming said first finite element representation from said first coordinate system into a second coordinate system;
generating through finite element analysis a first fluid flow representation in said second coordinate system based on said transformed first finite element representation, said first fluid flow representation providing a substantially linear representation of said fluid flow characteristic with respect to said second coordinate system;
mapping said first fluid flow representation to said first coordinate system;
providing a second finite element representation of said physical fluid reservoir in said first coordinate system, said second finite element representation associated with a second feature of said physical fluid reservoir;
generating a second fluid flow representation in said first coordinate system based on said second finite element representation; and
combining said mapped first fluid flow representation and said second fluid flow representation in said first coordinate system to obtain a combined fluid flow representation; and
displaying said combined fluid flow representation in a user interface of said computational system.

32. The method of claim 31, wherein providing said first finite element representation includes generating a finite element mesh of said physical fluid reservoir.

33. The method of claim 31, wherein said first coordinate system is a Cartesian coordinate system.

34. The method of claim 31, wherein said second coordinate system is a modified radial coordinate system.

35. The method of claim 34, wherein said modified radial coordinate system comprises the coordinates (s, θ, z), wherein s=ln(r).

36. The method of claim 31, wherein said feature is a well bore.

37. The method of claim 31, wherein said feature is a singularity.

38. The method of claim 37, wherein said singularity is a well bore.

* * * * *